(12) United States Patent
Hugosson

(10) Patent No.: US 6,887,562 B2
(45) Date of Patent: May 3, 2005

(54) SURFACE COATING OF A CARBIDE OR A NITRIDE

(76) Inventor: Håkan Hugosson, Ringgatan 16 B, SE-752 17 Uppsala (SE)

( * ) Notice: Subject to any disclaimer, the term of this patent is extended or adjusted under 35 U.S.C. 154(b) by 0 days.

(21) Appl. No.: 10/416,958
(22) PCT Filed: Sep. 27, 2001
(86) PCT No.: PCT/SE01/02078
  § 371 (c)(1), (2), (4) Date: Oct. 23, 2003
(87) PCT Pub. No.: WO02/40734
  PCT Pub. Date: May 23, 2002
(65) Prior Publication Data
  US 2004/0076856 A1 Apr. 22, 2004
(30) Foreign Application Priority Data
  Nov. 16, 2000 (SE) ................. 0004203
(51) Int. Cl.[7] .................. C23C 16/32; B23B 27/14
(52) U.S. Cl. ............... 428/212; 51/307; 51/309; 204/192.1; 427/249.1; 427/255.28; 427/255.395; 428/697; 428/698; 428/699
(58) Field of Search ................. 428/212, 697, 428/698, 699; 427/249.1, 255.28, 255.395; 204/192.1; 51/307, 309

(56) References Cited

U.S. PATENT DOCUMENTS

| | | | | |
|---|---|---|---|---|
| 4,714,660 A | * | 12/1987 | Gates, Jr. | 428/698 |
| 4,753,854 A | * | 6/1988 | Gavrilov et al. | 51/309 |
| 4,965,140 A | * | 10/1990 | Sarin | 428/699 |
| 5,478,634 A | | 12/1995 | Setoyama et al. | |
| 5,700,551 A | | 12/1997 | Kukino et al. | |
| 5,981,078 A | * | 11/1999 | Tabersky et al. | 427/255.391 |
| 6,033,768 A | * | 3/2000 | Muenz et al. | 204/192.1 |
| 6,241,431 B1 | * | 6/2001 | Derflinger et al. | 407/119 |
| 6,333,099 B1 | * | 12/2001 | Strondl et al. | 428/699 |
| 6,617,057 B2 | * | 9/2003 | Gorokhovsky et al. | 428/698 |

FOREIGN PATENT DOCUMENTS

| | | |
|---|---|---|
| EP | 0 448 720 | 10/1991 |
| EP | 0 709 483 | 5/1996 |
| JP | 60-248879 | * 12/1985 |
| JP | 07-173608 | * 7/1995 |
| WO | WO 98/44163 | 10/1998 |

* cited by examiner

Primary Examiner—Archene Turner
(74) Attorney, Agent, or Firm—Young & Thompson

(57) ABSTRACT

A surface coating comprising at least one carbide layer having the general formula MQC, wherein M is an element from the group consisting of Sc, Y, La, Ti, Zr, Hf, V, Nb, Ta or any mixture thereof, and Q is an element from the group consisting of Mn, Cr, Fe, Co, Ni, Cu, Mo, Tc, Ru, Rh, Pd, Ag, Re, W, Os, Ir, Pt, Au, Al or any mixture thereof. The layer comprises at least two different crystal structures or parts of such structures, and the relative amounts of M and Q in the layer are within a range in which the energy required for forming, a crystal structure of said carbide is generally equal for said at least two structures. The principle also applicable nitrides.

22 Claims, 5 Drawing Sheets

SURFACE COATING OF A CARBIDE OR A NITRIDE

FIELD OF THE INVENTION

The present invention relates to a surface coating comprising at least one carbide layer having the general formula MQC, wherein M is an element from the group consisting of Sc, Y, La, Ti, Zr, Hf, V, Nb, Ta or any mixture thereof, and Q is an element from the group consisting of Mn, Cr, Fe, Co, Ni, Cu, Mo, Tc, Ru, Rh, Pd, Ag, W, Re, Os, Ir, Pt, Au, Al or any mixture thereof.

The invention also relates to an analogous surface coating comprising at least one nitride layer having the general formula MQN, wherein M is an element from the group consisting of Sc, Y, La, Ti, Zr, Hf, or any mixture thereof, and Q is an element from the group consisting of V, Nb, Ta, Mn, Cr, Fe, Co, Ni, Cu, Mo, Tc, Ru, Rh, Pd, Ag, W, Re, Os, Ir, Pt, Au, Al or any mixture thereof.

It also relates to a method of producing a surface coating comprising at least one carbide layer having the general formula MQC, wherein M is an element from the group consisting of Sc, Y, La, Ti, Zr, Hf, V, Nb, Ta or any mixture thereof, and Q is an element from the group consisting of Mn, Cr, Fe, Co, Ni, Cu Mo, Tc, Ru, Rh, Pd, Ag, W, Re, Os, Ir, Pt, Au, Al or any mixture thereof, and in which a substrate is subjected to a simultaneous flow of atoms of M and Q under such conditions that the carbide is deposited on the substrate.

It further relates to a method of producing a surface coating comprising at least one nitride layer having the general formula MQN, wherein M is an element from the group consisting of Sc, Y, La, Ti, Zr, Hf or any mixture thereof, and Q is an element from the group consisting of V, Nb, Ta, Mn, Cr, Fe, Co, Ni, Cu, Mo, Tc, Ru, Rh, Pd, Ag, W, Re, Os, Ir, Pt, Au, Al or any mixture thereof, and in which a substrate is subjected to a simultaneous flow of atoms of M and Q under such conditions that the nitride is deposited on the substrate.

BACKGROUND OF THE INVENTION

Hard surface coatings are commonly deposited on cutting tools for metal machining, to provide a hard and wear resistant surface. But, coatings of this type may also be used to decrease wear between surfaces in a large variety of applications where two surfaces are in sliding contact, such as in bearings.

The present invention relates particularly to the art of coated cemented carbides and nitrides or similar hard materials such as cermets, ceramics and high speed steels. The method of depositing a thin refractory coating (1–20 .mu.m) of materials like alumina ($Al_2O_3$), titanium carbide (TiC) and/or titanium nitride (TiN) onto, e.g., a cemented carbide cutting tool, is a well-established technology and the tool life of the coated cutting tool, when used in metal machining, is considerably prolonged. The prolonged services life of the tool may, under certain conditions, extend up to several 100 percent. Refractory coatings known in the art comprise either a single layer or a combination of multilayers. Modern commercial cutting tools are characterized by a plurality of layer combinations with double or multilayer structures. The total coating thickness varies between 1 and 20 .mu.m and the thickness of individual layers may be in the sub micrometer range ($\mu$m), i.e., the thickness of the individual layers varies between a few microns and a few tenths of a micron.

The established technologies for depositing such coatings are Physical (PVD) and Chemical (CVD) Vapor Deposition (see, e.g., U.S. Pat. Nos. 4,619,866 and 4,346,123). PVD coated commercial cutting tools of cemented carbides or high speed steels usually have a single coating of TiN, TiCN, or TiAlN, but combinations thereof also exist.

There exist several PVD techniques capable of producing refractory thin layers on cutting tools. The most established methods are ion plating, magnetron sputtering, arc discharge evaporation and IBAD (Ion Beam Assisted Deposition). Each method has its own merits and the intrinsic properties of the produced coating such as microstructure/grain size, hardness, state of stress, cohesion and adhesion to the underlying substrate may vary depending on the particular PVD method chosen. An improvement in the wear resistance or the edge integrity of a PVD coated cutting tool being used in a specific machining operation can thus be accomplished by optimizing one or several of the above-mentioned properties. Furthermore, new developments of the existing PVD techniques by, for instance, introducing unbalanced magnetrons in reactive sputtering (S. Kadlec, J. Musil and W.-D. Munz in J. Vac. Sci. Techn. A8(3), (1990), 1318) or applying a steered and/or filtered arc in cathodic arc deposition (H. Curtins in Surface and Coatings Technology, 76/77, (1995), 632 and K. Atari et al. in Surface and Coatings Technology, 43/44, (1990), 312) have resulted in a better control of the coating processes and a further improvement of the intrinsic properties of the coating material.

Conventional cutting tool materials like cemented carbides comprise at least one hard metallic compound and a binder, usually cobalt (Co), where the grain size of the hard compound, e.g., tungsten carbide (WC), is in the 1–5 .mu.m range. Recent developments have predicted improved tool properties in wear resistance, impact strength and hot hardness by applying tool materials based on ultrafine microstructures by using nanostructured WC—Co powders as raw materials (L. E. McClandlish, B. H. Kear and B. K. Kim, in NanoSTRUCTURED Materials, Vol. 1, pp. 119–124, 1992). Similar predictions have been made for ceramic tool materials by, for instance, applying silicon nitride/carbide-based ($Si_3N_4$/SiC) nanocomposite ceramics and, for $Al_2O_3$-based ceramics, equivalent nanocomposites based on alumina.

With nanocomposite nitride or carbide hard coating materials, it is understood a multilayered coating where the thickness of each individual nitride (or carbide) layer is in the nanometer range, 3–100 nm, or preferably 3–20 nm. Since a certain periodicity or repeat period of, e.g., a metal nitride layer sequence is invoked, these nanoscaled, multilayer coatings have been given the generic name of "superlattice" layers. A repeat period is the thickness of two adjacent metal nitride layers, i.e., with different metal elements in the sublayers. Several of the metal nitride superlattice coatings with the metal element selected from Ti, Nb, V and Ta, grown on both single- and polycrystalline substrates have shown an enhanced hardness for a particular repeat period, usually in the range of 3–10 nm.

Recent developments in the field, are found in WO9844163 and WO9848072 (U.S. Pat. No. 6,103,357), both by Sandvik AB, Sweden. In WO9844163 Hogmark et al disclose a coating of superlattice type, comprising a laminar, multilayered structure of refractory compounds in polycrystalline, repetitive form, (MX/NX) lambda/(MX/NX) lambda/(MX/NX) lambda/(MX/NX) lambda/ . . . where the alternating layers MX and NX are composed of metalnitrides or carbides with the metal element selected from Ti, Nb, Hf, V, Ta, Mo, Zr, Cr and W. The repeat period lambda is essentially constant throughout the entire multi-layered structure, and larger than 3 nm but smaller than 100 nm, preferably smaller than 25 nm. While Selinder et al in WO9848072 disclose a coating comprising of a laminar, multilayered structure of refractory compounds in polycrystalline, non-repetitive form, MX/NX/MX/NX/MX . . . , where the alternating layers MX and NX are composed of metal nitrides or carbides with the metal elements M and N are selected from the group consisting of Ti, Nb, Hf, V, Ta, Mo, Zr, Cr, and W and mixtures therein, where in said coating the sequence of individual layer thicknesses has no repeat period but is essentially aperiodic throughout the entire mutlilayered structure, and where the said individual MX or NX layer thickness is larger than 0.1 nm but smaller than 30 nm and, varies essentially at random, and that the total thickness of said multilayered coating is larger than 0.5 .mu.m but smaller than 20 .mu.m.

In most prior art, two adjacent individual layers in the coating differ substantially in composition, whereby the deposition parameters in the PVD or CVD reactor must be altered in a correspondingly manner. The sequence of individual layer thicknesses can be fabricated by randomly opening and closing shutters from individual layer sources or by randomly switching such sources on and off. Another conceivable method is by randomly rotating or moving the to-be-coated tools, substrates, in front of said sources. Electron beam evaporation, magnetron sputtering or cathodic arc deposition or combinations thereof, are the preferred PVD methods for depositing nanostructured coatings.

Generally, the hardness and wear resistance of a material is related to the presence of glide planes in the material along which dislocations can propagate. Between coating layers of different constitution a change of material structure and glide plane position is likely to exist, promoting hardness and wear resistance of the material. A change of structure, from one phase to another, will result in a change in the glide plane symmetry and, hence, improved hardness and wear resistance.

U.S. Pat. No. 5,635,247 discloses a multilayer coating which is formed by depositing a kappa-alumina layer on a substrate, wet blasting the surface of the layer and then heat treating the coating to convert the kappa-alumina layer to the alfa-phase. One or more further alumina layers can then be deposited on the first layer. Thereby, layers of the same material but with different structures are created, resulting in broken or changed gliding planes in the border region between adjacent layers of different structure. Hence, an improved hardness and wear resistance is obtained.

However, the method described in the above document requires a special heat treatment of sub-layers in order to obtain the change of structure striven for. No prior multi-layer takes advantage of a multi-phase polytypic region, i.e a region where two or more of the lowest energy structures of a compound have the same, or almost the same, energies, for the compound or compounds used in the multi-layer in order to maximise the number of interfaces between sub-layers with different glide systems.

OBJECT OF THE INVENTION

It is an object of this invention to provide a hard and wear resistant refractory coating. It is also an object to provide a method by means of which a hard and wear resistant refractory coating can be produced in a cost efficient and reliable way.

The inventive coating and method of producing such a coating shall promote an efficient and reliable means of producing a cutting tool for metal machining, having a substrate of cemented carbide, cermet, ceramics or high speed steel. On the surface of said substrate, the hard and wear resistant refractory coating is preferably deposited by any PVD or CVD technique.

It is an aspect of the invention to provide a cutting tool comprising a body selected from the group consisting of sintered cemented carbide or cermet, ceramic or high speed steel and a wear resistant coating on at least part of the surface of the body, said coating comprising a laminar, multilayered structure of refractory compounds in a repetitive form, or non-repetitive, MX/QX/MX/QX/QX . . . , where the alternating layers MX and QX are composed of metal nitrides or carbides with the metal elements M and Q are selected from the group consisting of Sc, Y, La, Ti, Zr, Hf, V, Nb, Ta, Cr, Mo, W, Mn, Tc, Re, Fe, Ru, Os, Co, Rh, Ir, Ni, Cu, Ag, Au, Pd, Pt, Al and mixtures therein, and where the said individual MX or QX layer thickness is larger than 0.1 nm but smaller than 30 nm and, varies essentially at random, and that the total thickness of said multilayered coating is larger than 0.5 .mu.m but smaller than 20 .mu.m.

SUMMARY OF THE INVENTION

The object of the invention is achieved by means of the initially defined coating, characterised in that the layer comprises at least two different crystal structures or parts of such structures, and that the relative amounts of M and Q in the layer are within a range in which the energy required for forming a crystal structure of said carbide is generally equal for said at least two structures. In other words, the relative amounts of M and Q in the layer are within a range in which the energy required for forming a crystal structure of said carbide or nitride is generally equal, or close to equal, for at least two of the lowest energy structures of said carbide or nitride. The relative amounts of M and Q can be defined by means of the valence electron concentration VEC of the coating. This characterising feature promotes a random change of structure during the production of the coating by means of CVD or PVD techniques. Alternatively, it will be easy to change from formation of one structure to formation of another structure, for example between a cubic and an hexagonal structure, during the production of the coating by means of only small changes in the process. Accordingly, the sublayers of the coating will have a random or easily controlled structure variation through the thickness of the coating, resulting in improved hardness and wear resistance. The coating will comprise at least two different crystal structures, or be very rich in stacking faults or lack long range periodicity.

Preferably, the layer comprises more than two structures for MQC, the relative amounts of M and Q in the layer being within a range in which the energy required for forming a crystal structure of said carbide is generally equal for the structures. Thereby, the most preferred variation of structures in the coating is likely to be produced during the production thereof. According to this embodiment of the invention, the coating preferably comprises more than two structures of the relevant carbide or nitride, distributed in different sub-layers of the coating.

Though the invention is based on theoretical calculations, where the total energy of two structures is well-defined, such energy differences are not always directly relatable to physical situations, the energies calculated even differing between different theoretical methods. However, two or more structures can here be considered to be generally equal in energy if the energy difference between them is so small that any one of them may be grown or realised with only minor changes in growth conditions and/or productions parameters, e.g. changes in gas flow, deposition rate, gas composition, bias voltage, deposited layer thickness, judicious choice of substrate, and so on.

Here it should be mentioned that even though a certain structure by definition is comprised of a repeated configuration of close-packed, or close-packed-like planes, for example AABBAABB (TiAs) or ABCABC (NaCl), the inventive coating need not be comprised by a number of sub-layers each of which comprises a complete repetition of a certain structure. It lies in the nature of the invention that, during the production of the inventive coating, the formation of a first structure might change over, randomly or through control of the process, to the formation of a second structure before the characterising plane configuration of the first structure has even been completed. This can also manifest itself by the formation of a certain structure with the presence of a large number of stacking faults. Accordingly, the inventive coating, according to one embodiment, comprises a random configuration of close-packed planes, due to an ever changing structure during the production of the coating.

In accordance with the above statements, the carbide or nitride layer comprises at least two sub-layers of different structures. The relative amounts of M and Q is generally constant across the thickness of the deposited layer.

The object of the invention is also achieved by means of the initial methods, characterised in that a substrate is subjected to a simultaneous flow of atoms of M and Q under such conditions that the carbide or nitride layer is deposited on the substrate, and that at least two different carbide or nitride layer structures or parts of such structures are deposited on the substrate, the relative amounts of M and Q directed towards the substrate being chosen such that the energy required for forming a crystal structure of said carbide or nitride is generally equal for said at least two carbide or nitride structures. In other words the relative amounts of M and Q directed towards the substrate are chosen such that the energy required for forming a crystal structure of said carbide or nitride is generally equal, or close to equal, for at least two of the lowest energy structures of said carbide or nitride. Thereby, a random change of structure can occur during the formation of the coating. Alternatively, if there is such a difference between the formation energy that one structure is significantly more likely to be formed than the other structures, at least one production parameter, such as gas flow, hydrogen content etc., is adjusted during the deposition of the carbide or nitride onto the substrate, such that the formation of one of said at least two structures is at least temporarily promoted. Such control may include a minor change of the relative amounts of M and Q atoms directed towards the substrate.

However, it is preferred that the relative amounts of M and Q directed towards the substrate are such that any differences in forming-energy between said at least two structures is small enough to permit a random transition from the formation of one of said structures to the formation of the second or other structure under the prevailing production conditions. Accordingly, the carbide or nitride is deposited onto the substrate under generally constant production conditions, at least two structures, for example one or more cubic and one or more hexagonal structures, thereby being randomly formed in the carbide or nitride layer.

Preferably, the relative amounts of M and Q directed towards the substrate are such that the energy required for forming a crystal structure of said carbide or nitride (under the prevailing production conditions) is generally equal for more than two of the structures of said carbide or nitride. Thereby, a favorable variety of structures and a corresponding diversity of glide planes of different direction and position in the coating will be present in the coating. Such a coating, with several layers of different stacking sequences (see below), can also be viewed as having no long-range repetition, or as being rich in stacking faults.

An often encountered problem in the manufacture and use of multi layers is that stress tends to be concentrated in the interfaces between sub-layers differing in chemical composition, and therefore exfoliation (peeling) is liable to occur at interfaces. This problem is increased if the sub-layers also differ in structure. It lies in the nature of the invention here detailed that, since the sub-layers differ only in structure, and not, or only slightly, in chemical constitution, this problem with exfoliation should decrease.

The invention also comprises a cutting tool, preferably for machining purposes, which comprises a surface coating in accordance with the invention.

Further features and advantages of the present invention will be described in the following description of the invention and in the appended claims.

DETAILED DESCRIPTION OF THE PREFERRED EMBODIMENTS OF THE INVENTION

Figure 1:
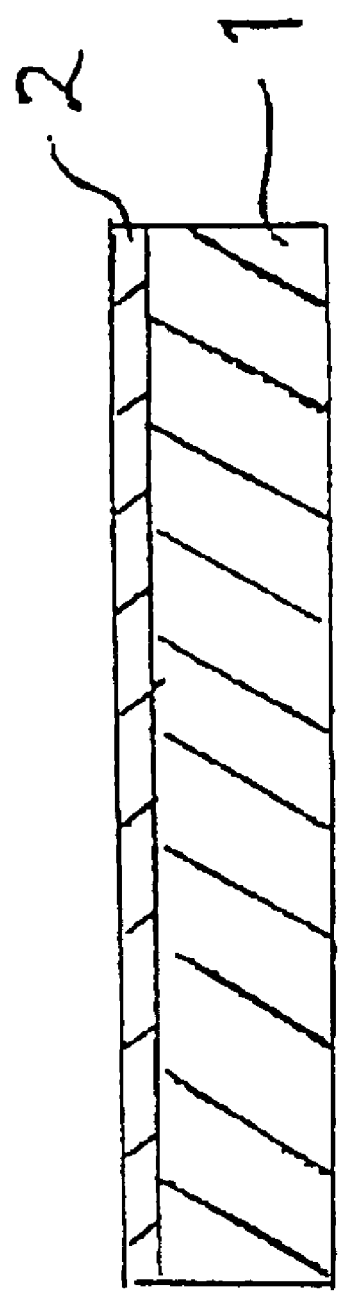
FIG. 1 is a schematic drawing showing a substrate 1 coated with a laminar, multilayered carbide coating 2.

Carbides and nitrides of the elements in group 4b to 7b in the periodic system are known to be exceptionally hard. Out of these substances, the carbides of the elements in group 6b and 7b have a hexagonal crystal structure of WC type under normal conditions (with some exceptions among the 3d elements (Cr, Mn), while the ones in group 4b and 5b have a cubic crystal structure of NaCl type. The nitrides typically form in the NaCl structure for the group III to V elements with other phases also being present for groups V–VII. In addition to these main crystal structures, other structures have been observed when alloying and/or altering one or more parameters, such as temperature, pressure and composition. Particularly of interest for this invention are structures which have been observed for carbides of the general formula $M_xQ_{(1-x)}C$, wherein M is an element from group 5b or lower, and Q is an element from group 6b or higher for the carbides. For the nitrides M is an element from group 4 or lower and Q is an element from group 5 and higher. M and Q may further be mixtures of two or more elements.

By theoretical calculations (FIGS. 3a–c) the inventor has foreseen that carbides of the general formula $M_xQ_{(1-x)}C$, have a multi-phase/polytypic region when $x_{low} < x < x_{high}$. This multi-phase/polytypic region is characterized by that two or more different crystalline structures are essentially equally stable under the given deposition conditions. When depositing such a carbide, the resulting structure may therefore be randomly structured, or may switch between two or more structures, for example one cubic and one hexagonal structure or be rich in stacking faults. Likewise the inventor has forseen that a similar multi-phase region will be present for the nitrides at a different composition.

Figure 2:
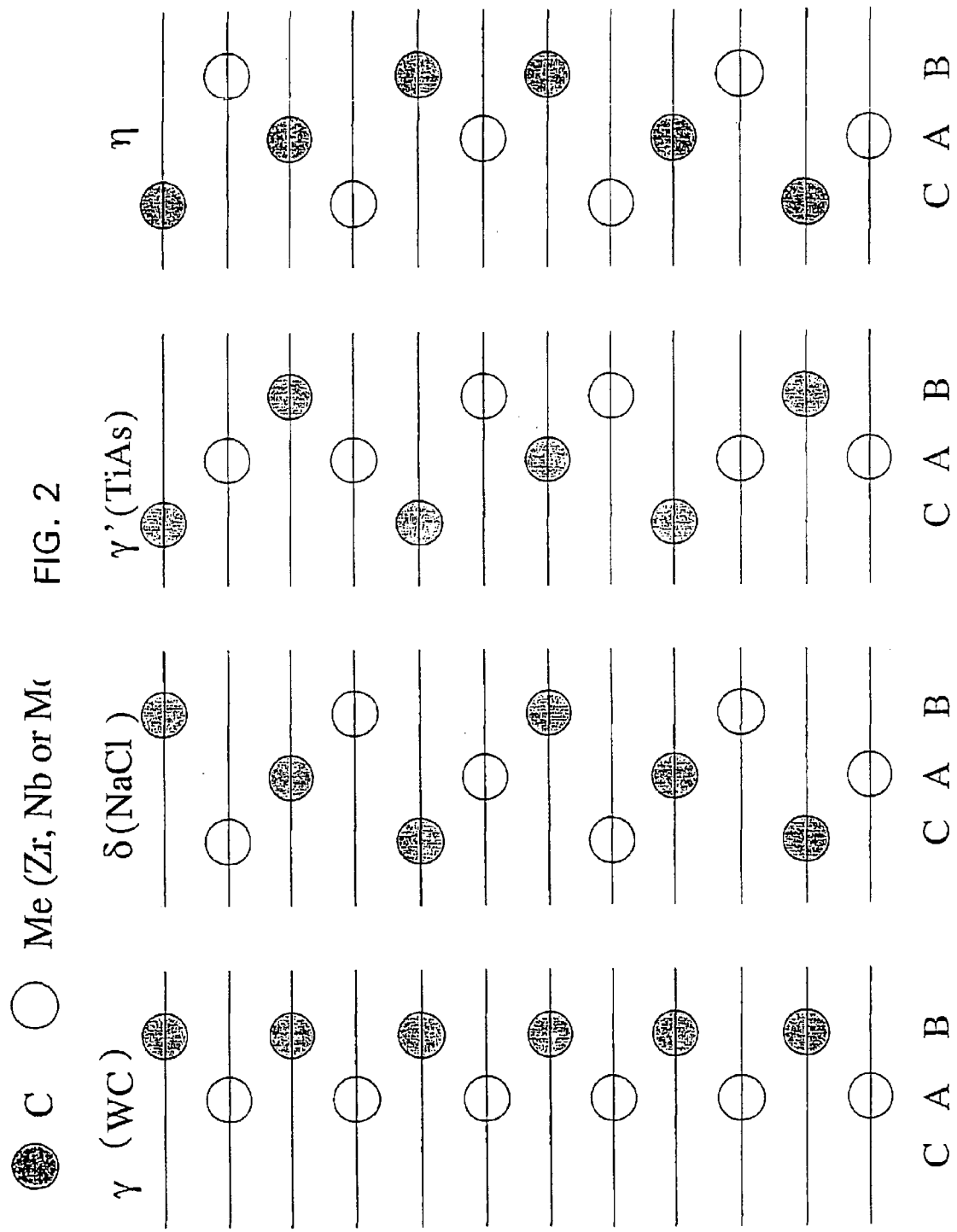
FIG. 2 illustrates the concept of stacking sequences of close-packed-like planes of metal and non-metal (carbon or nitrogen) atoms typical for describing transition metal carbide and nitride phases. In this figure is shown the structures of the $\delta$ (AcBaCbAcBaCb), $\gamma$ (AbAbAbAb), $\gamma'$ (AbAcBaBc) and $\eta$ (AcBaCbAbCaBc) phases of MoC.

In transition metal carbides and nitrides the metal atoms are arranged in such a way that they form metal layers, with closed-packed-like arrangements, with hexagonal or cubic stacking sequence or mixtures thereof. The carbon or nitrogen atoms occupy the octahedral interstitial sites between the metal atom layers. This description of the different phases as variations of stacking sequences is exemplified in FIG. 2. The positions of the atoms can thus described by the hexagonal close packed positions A, B or C (a, b or c for the carbon atoms). For example, the NaCl-structure (i.e. typical for NaCl) is described by the stacking sequence AcBaCbAcBaCb, while the TiAs-structure is described by AbAcBaBc and the WC-structure by AbAbAbAb. These structures, typical for NaCl, TiAs and WC, are also defined as the δ, γ and γ' structures shown in FIG. 2.

From the above definition follows that if a coating is established to have the following (hypothetical) stacking sequence AbAbAbAcBaCbAcBaCbAbAbAbA it can either be viewed as i) AbAbAb|AcBaCbAcBaCb|AbAbAbA: two layers (of 3 and 4 metal plane thickness respectively) of WC-structure with one layer of NaCl-structure (6 metal planes thickness) between, or ii) as an entirely new structure: AbAbAbAcBaCbAcBaCbAbAbAbA.

Figure 3A:
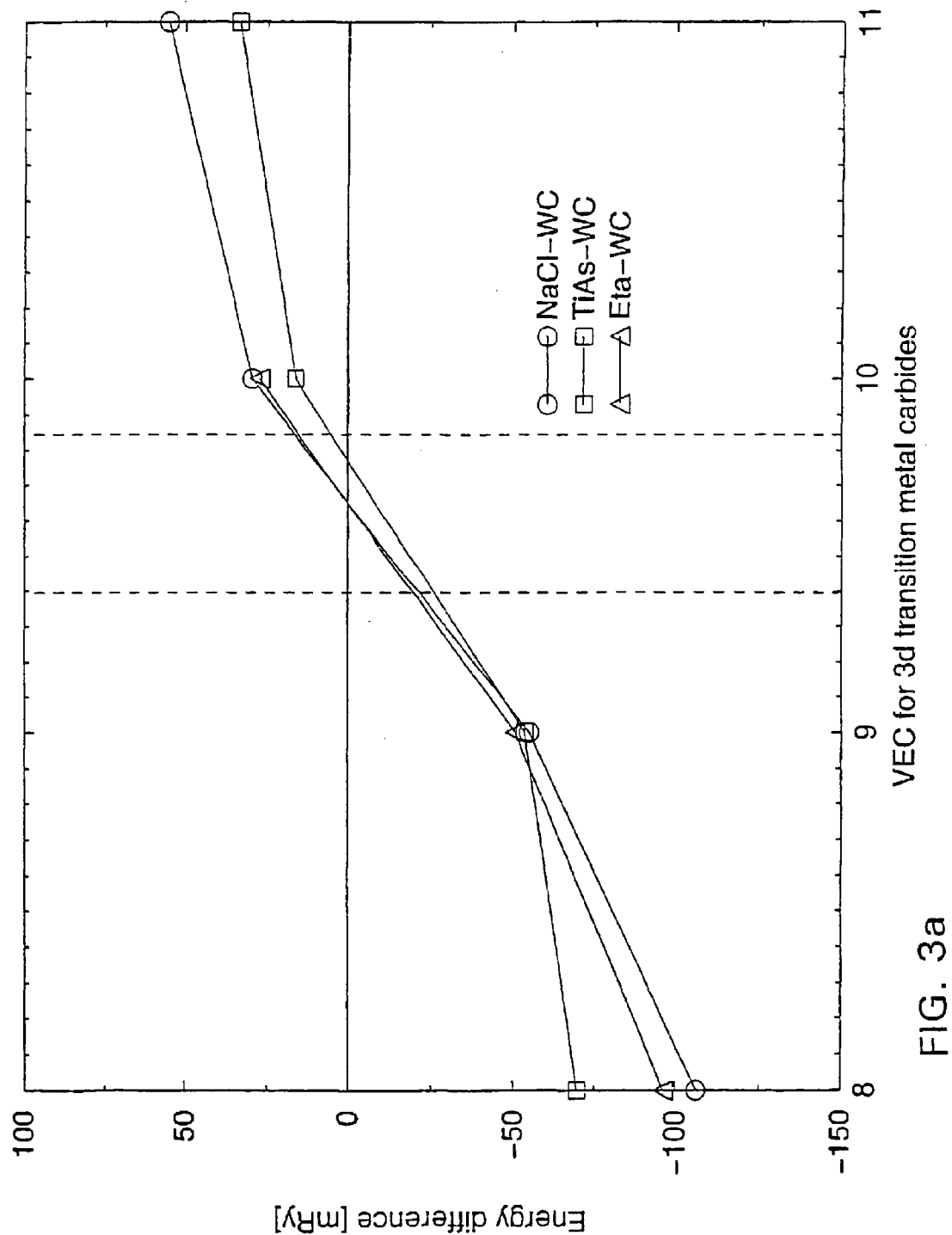
FIGS. 3a–c illustrate the results of the theoretical calculations made by the inventor on the relative phase stabilities of four different experimentally verified structures for the transition metal carbides.
Figure 3B:
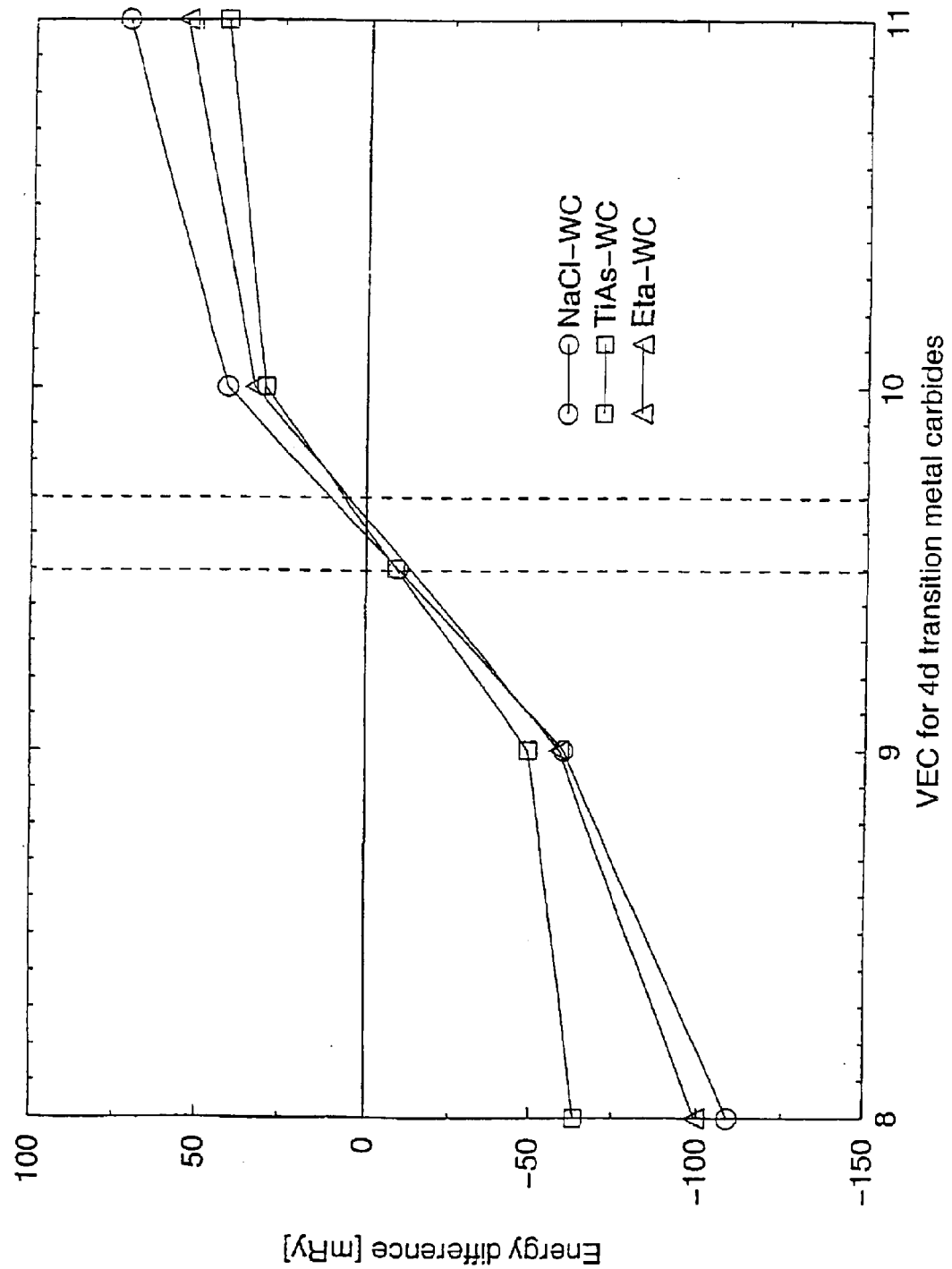
Figure 3C:
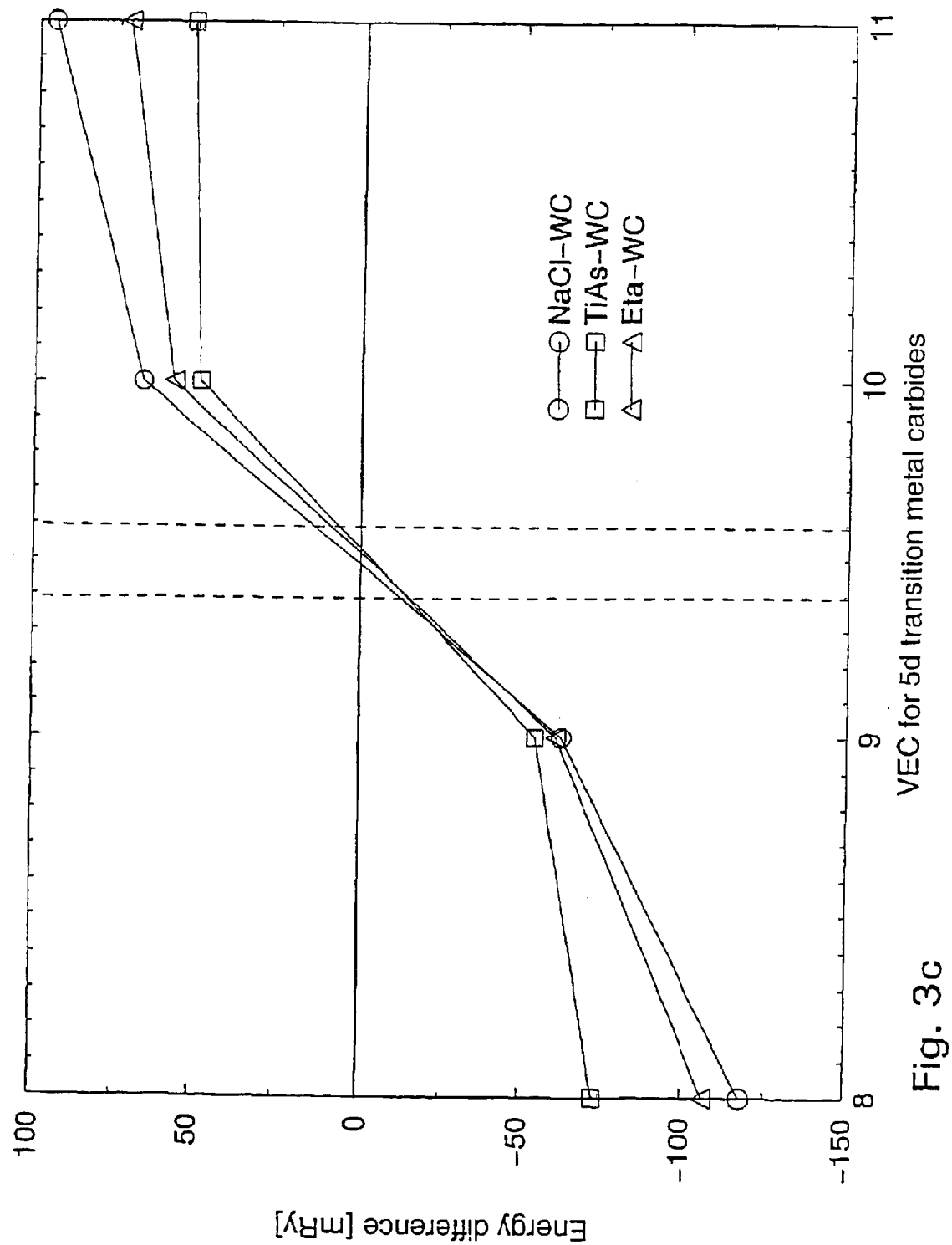

In general it may be said that the region of VEC which two structures of the carbides have the same or similar energies may be found by linear interpolation between two energy points for a chosen structures in two, or more, compounds from the group V and VI elements given by FIGS. 3a–c. These compounds may, or may not, be from the same row in the periodic table of elements. The point in VEC at which the interpolation crosses the zero reference energy, being the WC-structure, is the VEC at, or around, which this structure has the same, or similar, energies as the WC-structure. A similar and analogous scheme may be constructed to determine the VEC at which any of the four structures studied have the same, or similar, energies. By mixing or alloying a compound may be formed with the defined VEC and the said structures of said compound will have the same, or similar, energies. FIGS. 3a–c show the VEC that must be obtained in order to find the multi phase region (e.g. 9.5–9.9 for 3d metal carbides). All combinations of M and Q may then be produced in such a way that the VEC shown in FIGS. 3a–c is obtained. The only important thing is thus to combine the metals such that the required VEC is obtained. For example, this might be obtained with 50% Nb+50% Mo, or 75% Nb+25% Tc, etc.

It is also predicted from similar calculations that for the nitrides a similar region in VEC, where one or more structures have the same, or similar, energies, is also present in those systems. This region will generally be at the same VEC as that predicted for the carbidesk.

Depending on the slope of the linear extrapolation between two energy points the region around which the energy of two structures will be the same, or similar, will increase or decrease. Generally it may be said that the greater the difference in energy between two phases is, the more drastic change in the production parameters will be necessary in order to promote growth of the less energetically favored phase or phases.

FIGS. 3a to 3c show the calculated relative phase stabilities vs. the valence electron concentration (VEC) for the above mentioned carbides. The valence electron concentration (VEC) for a compound is defined as the sum of the number of valence electrons of the consituent atoms in a compound. NbC, for example, is said to have a valence electron concentration of 9, since Nb has 5 valence electrons (5s1 and 4d4) and carbon has 4 valence electrons (2s2 and 2p2). By alloying, e.g, NbC with Mo (with 6 valence electrons—5s1 and 4d5) the valence electron concentration of the compound can be said to change continuously from VEC=9 (NbC) to VEC=10 (MoC).

The theoretical relative phase stabilities that are shown result from calculations wherein M and Q are 3d, 4d and 5d transition metals. The calculations are so-called first-principles all-electron electronic structure calculations within density functional theory (DFT) using the local spin density approximation (LSDA). For those well knowledgeable in the field the method used has been a full-potential linear-muffin-tin orbital (FP-LMTO) method and a pseudopotential plane-wave method. These calculations are to be considered as state-of-the-art theoretical studies with well documented ability to predict the ground-state properties, such as phase stabilities, of the compounds considered.

According to the presently claimed invention, there is further provided a cutting tool comprising a body of a hard alloy of cemented carbide, cermet, ceramics or high speed steel, onto which a wear resistant, multilayered coating has been deposited. More specifically, the coated tool comprises a substrate of sintered cemented carbide body or a cermet, preferably of at least one metal carbide in a metal binder phase, or a ceramic body. The substrate may also comprise a high speed steel alloy. Said substrate may also be pre-coated with a thin single or multilayer of TiN, TiC, TiCN or TiAlN with a thickness in the micrometer range according to prior art. The coated cutting tool according to the presently claimed invention, exhibits improved wear resistance and toughness properties compared to prior art tools. FIG. 1 shows such a substrate 1 provided with the coating 2 according to the invention.

According to one general embodiment, the valence electron concentration (VEC) for said carbide is in the range of 9.30–9.90, preferably 9.40–9.85.

According to another embodiment, shown in FIG. 3a, M is an element from the group consisting of Sc, Ti, V or any mixture thereof, and Q is an element from the group consisting of Mn, Cr, Fe, Co, Ni, Cu or any mixture thereof. Preferably x is then selected such that the valence electron concentration (VEC) for said carbide is in the range of 9.50–9.90, preferably 9.55–9.85.

According to a further embodiment, shown in FIG. 3b, M is an element from the group consisting of Y, Zr, Nb or a mixture thereof, and Q is an element from the group consisting of Mo, Tc, Ru, Rh, Pd, Ag or a mixture thereof. In this case x is selected such that the valence electron concentration (VEC) for said carbide is in the range of 9.40–9.80, preferably 9.50–9.70.

According to yet another embodiment, shown in FIG. 3c, M is an element from the group consisting of La, Hf, Ta and mixtures therein, and Q is an element from the group consisting of Re, W, Os, Ir, Pt, Au and mixtures therein. x is selected such that the valence electron concentration (VEC) for said carbide is in the range of 9.30–9.70, preferably 9.40–9.60.

According to one general embodiment, the valence electron concentration (VEC) for said nitride is in the range of 9.30–9.90, preferably 9.40–9.85.

According to another embodiment M is an element from the group consisting of Sc and Ti or any mixture thereof, and Q is an element from the group consisting of V, Mn, Cr, Fe, Co, Ni, Cu or any mixture thereof. Preferably x is then selected such that the valence electron concentration (VEC) for said nitride is in the range of 9.50–9.90, preferably 9.55–9.85.]

According to a further embodiment M is an element from the group consisting of Y and Zr or a mixture thereof, and Q is an element from the group consisting of Nb, Mo, Tc, Ru, Rh, Pd, Agor a mixture thereof. In this case x is selected such that the valence electron concentration (VEC) for said nitride is in the range of 9.40–9.80, prefererably 9.50–9.70.

According to yet another embodiment M is an element from the group consisting of La and Hf and mixtures therein, and Q is an element from the group consisting of Ta, Re, W, Os, Ir, Pt, Au and mixtures therein. x is selected such that the valence electron concentration (VEC) for said nitride is in the range of 9.30–9.70, preferably 9.40–9.60.

Elements M and Q may also be chosen from different rows of the periodic table, for example M may be chosen from the 3d metals while Q is chosen from the 4d or 5d metals. In such a case the necessary VEC may be calculated from the energy values in FIGS. 3a–c, in a way analogous to that depicted in said figures.

In order to obtain the desired relative amounts of M and Q, the amount of M and Q atoms directed towards the substrate onto which they are deposited is controlled. Preferably, the deposition method follows the principles of chemical vapor deposition CVD or physical vapor deposition PVD. Sputtering is a possible technique for producing the coating. The deposition conditions can be controlled in a plurality of ways, such as amount of M and Q atoms directed towards the substrate, temperature, pressure, etc.

A plurality of preferred carbides and nitrides are listed below produced by means of the inventive method and the presenting such relative amounts of the metals included therein that the characteristic VEC is obtained.

Carbides:
Ternary:
TiCrC, TiMnC, TiMoC, TiRuC, TiWC, TiReC, VCrC, VMnC, VMoC, VRuC, VWC, VReC.
ZrCrC, ZrMnC, ZrMoC, ZrRuC, ZrWC, TiReC, NbCrC, NbMnC, NbMoC, NbRuC, NbWC, NbReC.
HfCrC, HfMnC, HfMoC, HfRuC, HfWC, HfReC, TaCrC, TaMnC, TaMoC, TaRuC, TaWC, TaReC.
Quartenary:
TiVCrC, TiVMnC, TiVMoC, TiVRuC, TiVWC, TiVReC, TiCrMnC, TiMoRuC, TiWReC, VCrMnC, VMoRuC, VWReC.
ZrNbCrC, ZrNbMnC, ZrNbMoC, ZrNbRuC, ZrNbWC, ZrNbReC, ZrCrMnC, ZrMoRuC, ZrWReC, NbCrMnC, NbMoRuC, NbWReC.
HfTaCrC, HfraMnC, HflaMoC, HflaRuC, HflaWC, HflaReC, HfCrMnC, HfMoRuC, HfWReC, TaCrMnC, TaMoRuC, TaWReC.
TiNbCrC, TiNbMoC, TiNbWC, TiTaCrC, TiTaMoC, TiTaWC, ZrVCrC, ZrVMoC, ZrVWC, ZrTaCrC, ZrTaMoC, ZrTaWC, HfVCrC, HfVMo, HfVWC, HfNbCrC, HfNbMoC, HfNbWC, TiZrCrC, TiZrMoC, TiZrWC, TiHfCrC, TiHfMoC, TiHfWC.
Nitrides:
Ternary:
TiVN, TiCrN, TiNbN, TiMoN, TiTaN, TiWN.
ZrVN, ZrCrN, ZrNbN, ZrMoN, ZrTaN, ZrWN.
HfVN, HfCrN, HfNbN, HfMoN, HfTaN, HfWN.

Quartenary:
TiVCrN, TiNbMoN, TiTaWN, TiVMoN, TiVWN, TiNbCrN, TiNbWN, TiTaCrN, TiTaMoN.
ZrVCrN, ZrNbMoN, ZrTaWN, ZrVMoN, ZrVWN, ZrNbCrN, ZrNbWN, ZrTaCrN, ZrTaMoN.
HfVCrN, HfNbMoN, HfTaWN, HfVMoN, HfVWN, HfNbCrN, HfNbWN, HfTaCrN, HfTaMoN.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

For example, the material defined as a coating material in the above description may also be used as a binder phase material in binder or so-called binderless cemented carbides replacing for example TiC, MoC and/or cobalt or mixtures thereof. Furthermore the materials defined as coating materials above may conceivably be used in bulk applications, such as small bodies of materials, e.g ball bearings, where the properties of these hard materials may find further use.

It should also be understood that the inventive coating layer or layers may be supplemented by further layers produced by other techniques than those proposed in this application, such as conventional PVD or CVD techniques. Accordingly, multilayer structures in which the inventive layer is one among one or more further layers is within the conceptional idea of the invention. Such further layers need not be carbides or nitrides, but could as well comprise other suitable compounds.

It should further be noted that the sought after VEC can be accomplished by not only ternary compounds, of general form MQC or MQN, but also of higher degrees of alloying, for example quaternary alloys of form MQLC or MQLN and so on.

The inventive concept, as defined for carbides and nitrides individually in this application, is also applicable for carbonitrides.

What is claimed is:

1. A surface coating comprising at least one carbide layer having the general formula MQC, wherein M is an element from the group consisting of Sc, Y, La, Ti, Zr, Hf, V, Nb, Ta or any mixture thereof, and Q is an element from the group consisting of Mn, Cr, Fe, Co, Ni, Cu, Mo, Tc, Ru, Rh, Pd, Ag, Re, W, Os, Ir, Pt, Au, Al or any mixture thereof, characterised in that the layer comprises at least two different crystal structures or parts of such structures, and that the relative amounts of M and Q in the layer are within a range in which the energy required for forming a crystal structure of said carbide is generally equal for said at least two structures.

2. A surface coating according to claim 1, characterised in that the carbide has the general formula MxQ(1−x)C, wherein 0<x<1, and x is selected such that the valence electron concentration (VEC) for said carbide is in the range of 9.30–9.90.

3. A surface coating according to claim 2, wherein M is an element from the group consisting of Sc, Ti, V or any mixture thereof, and Q is an element from the group consisting of Mn, Cr, Fe, Co, Ni, Cu or any mixture thereof, characterised in that, x is selected such that the valence electron concentration (VEC) for said carbide is in the range of 9.50–9.90.

4. A surface coating according to claim 2, wherein M is an element from the group consisting of Y, Nb, Zr or a mixture thereof, and Q is an element from the group consisting of Mo, Tc, Ru, Rh, Pd, Ag or a mixture thereof, characterised in that x is selected such that the valence electron concentration (VEC) for said carbide is in the range of 9.40–9.80.

5. A surface coating according to claim 2, wherein M is an element from the group consisting of La, Hf, Ta and mixtures therein, and Q is an element from the group consisting of Re, W, Os, Ir, Pt, Au and mixtures therein, characterised in that x is selected such that the valence electron concentration (VEC) for said carbide is in the range of 9.30–9.70.

6. A surface coating according to claim 1, characterised in that M is an element from one row of the periodic table and Q is from another row of the periodic table.

7. A surface coating according to claim 1, characterised in that the relative amounts of M and Q is generally constant across the thickness of the deposited layer.

8. A surface coating according to claim 1, characterised in that M and Q belong to adjacent columns in the periodic table, i.e the number of valence electrons differs by one.

9. A cutting tool, characterised in that it comprises a coating according to claim 1.

10. A surface coating comprising at least one nitride layer having the general formula MQN, wherein M is an element from the group consisting of Sc, Y, La, Ti, Zr, Hf or any mixture thereof, and Q is an element from the group consisting of V, Nb, Ta, Mn, Cr, Fe, Co, Ni, Cu, Mo, Tc, Ru, Rh, Pd, Ag, Re, W, Os, Ir, Pt, Au, Al or any mixture thereof, characterised in that the layer comprises at least two different crystal structures or parts of such structures, and that the relative amounts of M and Q in the layer are within a range in which the energy required for forming a crystal structure of said nitride is generally equal for said at least two structures.

11. A surface coating according to claim 10, characterised in that the nitride has the general formula $M_xQ_{(1-x)}N$, wherein $0<x<1$, and x is selected such that the valence electron concentration (VEC) for said nitride is in the range of 9.30–9.90.

12. A surface coating according to claim 11, wherein M is an element from the group consisting of Sc, Ti or any mixture thereof, and Q is an element from the group consisting of V, Mn, Cr, Fe, Co, Ni, Cu or any mixture thereof, characterised in that, x is selected such that the valence electron concentration (VEC) for said nitride is in the range of 9.5–9.90.

13. A surface coating according to claim 11, wherein M is an element from the group consisting of Y and Zr or a mixture thereof, and Q is an element from the group consisting of Nb, Mo, Tc, Ru, Rh, Pd, Ag or a mixture thereof, characterised in that x is selected such that the valence electron concentration (VEC) for said nitride is in the range of 9.40–9.80.

14. A surface coating according to claim 11, wherein M is an element from the group consisting of La and Hf and mixtures therein, and Q is an element from the group consisting of Ta, Re, W, Os, Ir, Pt, Au and mixtures therein, characterised in that x is selected such that the valence electron concentration (VEC) for said nitride is in the range of 9.30–9.70.

15. A method of producing a surface coating comprising at least one carbide layer having the general formula MQC, wherein M is an element from the group consisting of Sc, Y, La, Ti, Zr, Hf, V, Nb, Ta or any mixture thereof, and Q is an element from the group consisting of Mn, Cr, Fe, Co, Ni, Cu Mo, Tc, Ru, Rh, Pd, Ag W, Re, Os, Ir, Pt, Au, Al or any mixture thereof, characterised in that a substrate is subjected to a simultaneous flow of atoms of M and Q under such conditions that the carbide layer is deposited on the substrate, and that at least two different carbide layer structures or parts of such structures are deposited on the substrate, the relative amounts of M and Q directed towards the substrate being chosen such that the energy required for forming a crystal structure of said carbide is generally equal f or said at least two carbide structures.

16. A method of producing a surface coating comprising at least one nitride layer having the general formula MQN, wherein M is an element from the group consisting of Sc, Y, La, Ti, Zr, Hf, or any mixture thereof, and Q is an element from the group consisting of V, Nb, Ta, Mn, Cr, Fe, Co, Ni, Cu, Mo, To, Ru, Rh, Pd, Ag, W, Re, Os, Ir, Pt, Au, Al or any mixture thereof, characterised in that a substrate is subjected to a simultaneous flow of atoms of M and Q under such conditions that the nitride is deposited on the substrate, and that at least two different nitride layer structures or parts of such structures are deposited on the substrate, the relative amounts of M and Q directed towards the substrate being chosen such that the energy required for forming a crystal structure of said nitride is generally equal for said at least two nitride structures.

17. A method according to claim 15, or 16 characterised in that the relative amounts of M and Q directed towards the substrate are such that any differences in forming-energy between said at least two structures is small enough to permit a random transition from the formation of one of said structures to the formation of a second or other structure under the prevailing production conditions.

18. A method according to claim 17, characterised in that the carbide or nitride is deposited onto the substrate under generally constant production conditions, at least two structures thereby being randomly formed in the carbide or nitride layer.

19. A method according to claim 15, or 16 characterised in that, during the deposition of the carbide or nitride onto the substrate, at least one production parameter is adjusted such that the formation of one of said at least two structures is at least temporarily promoted.

20. A method according to claim 19, characterised in that said parameter is the amount of M or Q directed towards the substrate.

21. A method according to claim 15, characterised in that the carbide or nitride layer is deposited by means of vapor deposition method.

22. A method according to claim 15, characterised in that the carbide or nitride is deposited by means of a sputtering technique.

* * * * *